(12) United States Patent
Fang

(10) Patent No.: US 10,263,000 B2
(45) Date of Patent: Apr. 16, 2019

(54) DEVICE COMPRISING CAPACITOR AND FORMING METHOD THEREOF

(71) Applicant: UNITED MICROELECTRONICS CORP., Hsin-Chu (TW)

(72) Inventor: Linggang Fang, Singapore (SG)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 15/697,459

(22) Filed: Sep. 7, 2017

(65) Prior Publication Data

US 2019/0057968 A1 Feb. 21, 2019

(30) Foreign Application Priority Data

Aug. 21, 2017 (CN) .......................... 2017 1 0717139

(51) Int. Cl.
*H01L 27/108* (2006.01)
*H01L 49/02* (2006.01)

(52) U.S. Cl.
CPC .. *H01L 27/10829* (2013.01); *H01L 27/10852* (2013.01); *H01L 28/40* (2013.01)

(58) Field of Classification Search
CPC ..................... H01L 27/0629; H01L 27/11573
See application file for complete search history.

(56) References Cited

U.S. PATENT DOCUMENTS

| | | | | |
|---|---|---|---|---|
| 7,186,625 | B2* | 3/2007 | Chudzik | H01L 23/5223 257/E21.016 |
| 7,968,924 | B2* | 6/2011 | Sato | H01L 27/105 257/296 |
| 9,136,360 | B1* | 9/2015 | Perera | H01L 29/66833 |
| 9,397,112 | B1* | 7/2016 | Chuang | H01L 21/28273 |
| 9,559,178 | B2* | 1/2017 | Sekine | H01L 29/42344 |
| 2011/0095348 | A1* | 4/2011 | Chakihara | H01L 21/28273 257/298 |
| 2013/0175599 | A1* | 7/2013 | Yang | H01L 22/14 257/324 |
| 2014/0065776 | A1* | 3/2014 | Mihara | G11C 11/5671 438/239 |
| 2016/0190143 | A1* | 6/2016 | Chuang | H01L 29/408 257/326 |
| 2016/0379988 | A1 | 12/2016 | Chuang | |

* cited by examiner

*Primary Examiner* — Su C Kim
*Assistant Examiner* — David S Wilbert
(74) *Attorney, Agent, or Firm* — Winston Hsu

(57) ABSTRACT

A device including a capacitor includes an isolation structure, a first control gate, a first selective gate and a first dielectric layer. The isolation structure is disposed in a substrate. The first control gate and the first selective gate are disposed directly above the isolation structure. The first dielectric layer is vertically sandwiched by the first control gate and the first selective gate, thereby constituting the capacitor. The present invention also provides a method of forming the device including the capacitor.

8 Claims, 5 Drawing Sheets

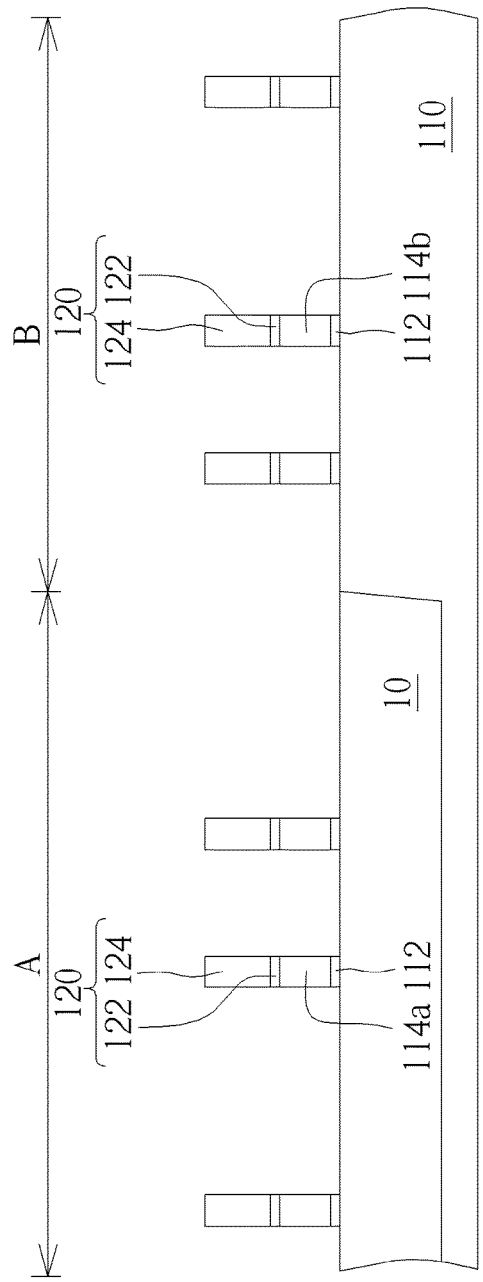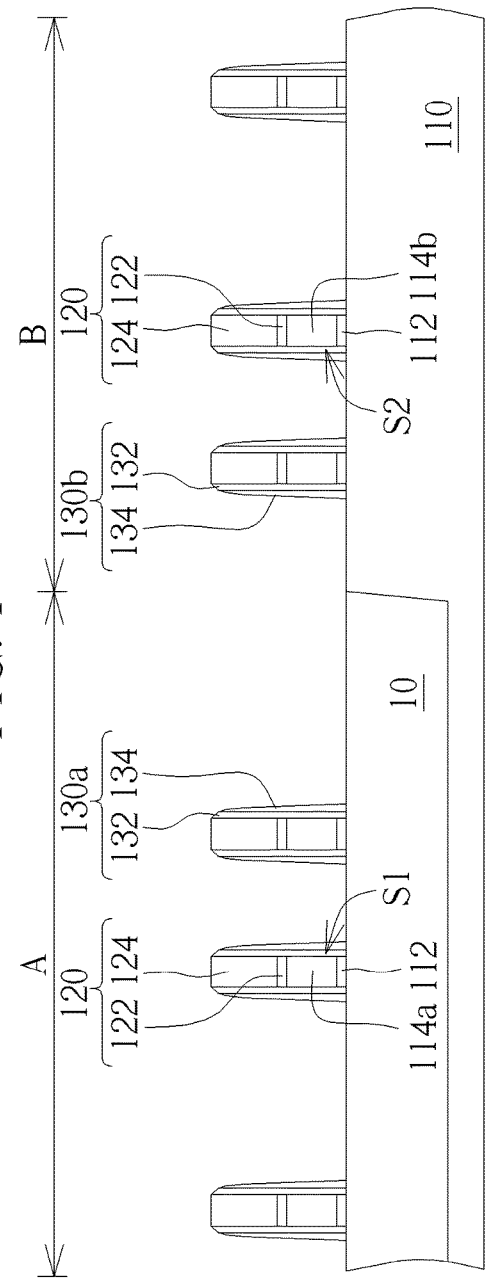

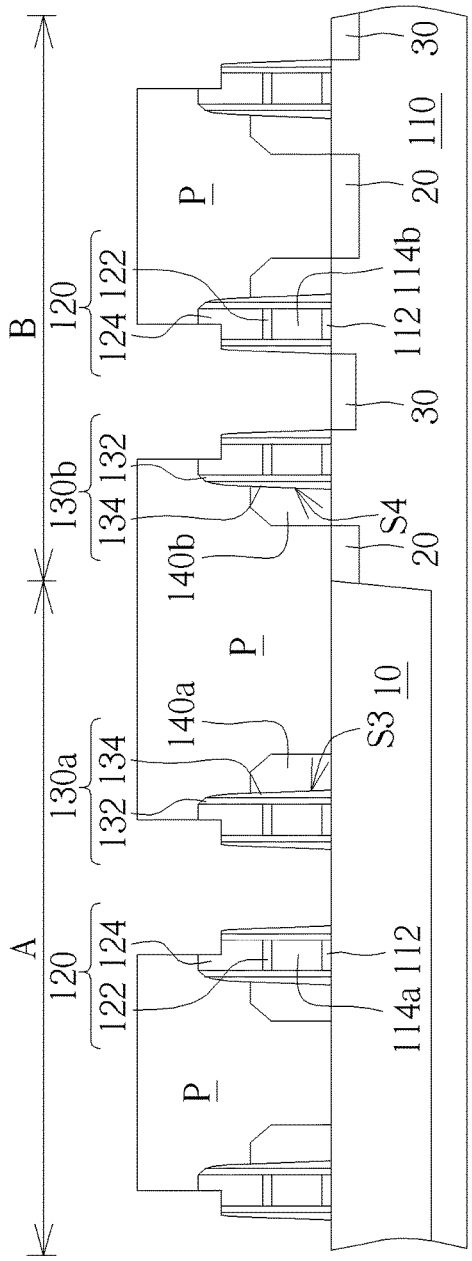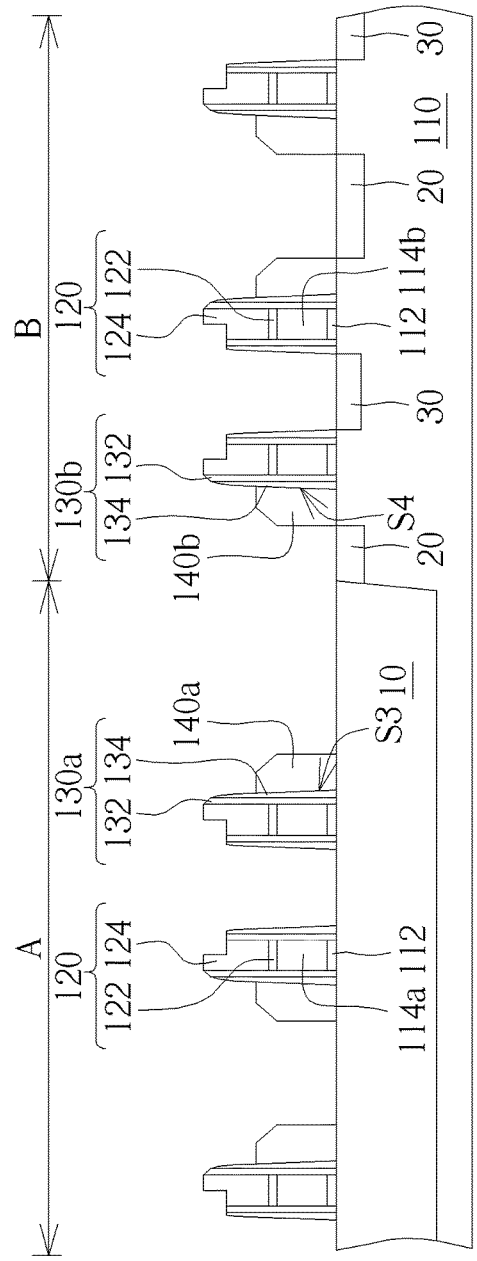

DEVICE COMPRISING CAPACITOR AND FORMING METHOD THEREOF

BACKGROUND OF THE INVENTION

Field of the Invention

The present invention relates generally to a device including a capacitor and forming method thereof, and more specifically to a device using a memory structure as a capacitor and a forming method thereof.

Description of the Prior Art

Each capacitor in a semiconductor component includes two electrodes and a dielectric layer between the two electrodes. This structure has been widely used in many semiconductor components. A capacitor process may comprise the following steps: a conductive layer is formed on a substrate and is patterned to form a lower electrode of the capacitor; a dielectric layer is formed on the lower electrode; then, another conductive layer covers the dielectric layer to form the capacitor.

The materials of the electrodes may include polysilicon, polycide and metal, and there are three fabricating methods for forming three kinds of capacitors in the semiconductor wafer industry: Metal-insulator-Metal (MIM) capacitors; Poly-insulator-Poly (PIP) capacitors; and Metal Oxide Semiconductor (MOS) capacitors, that are compatible with MOS transistor processes for achieving process simplification. A MIM capacitor is constituted by two metals serving as electrodes. A PIP capacitor is constituted by two polysilicon layers serving as electrodes. A MOS capacitor is constituted by connecting a source and a corresponding drain of a MOS transistor serving as one electrode while a gate of the MOS transistor serves as the other electrode.

As the integration of an integrated circuit increases and sizes of its semiconductor components shrink, it has become an issue in the industry to integrate these components (such as capacitors and transistors) for achieving desired capacitance and operation power, simplifying processes and reducing processing costs.

SUMMARY OF THE INVENTION

The present invention provides a device including a capacitor and a forming method thereof, which applies a memory structure as a capacitor to forma high voltage capacitor, and integrate a capacitor processes into a memory processes.

The present invention provides a device including a capacitor, including an isolation structure, a first control gate, a first selective gate and a first dielectric layer. The isolation structure is disposed in a substrate. The first control gate and the first selective gate are disposed directly above the isolation structure. The first dielectric layer is vertically sandwiched by the first control gate and the first selective gate, thereby constituting the capacitor.

The present invention provides a method of forming a device including a capacitor, including the following steps. A substrate including a capacitor area is provided. An isolation structure is in the substrate of the capacitor area. A first control gate is formed directly above the isolation structure. A first dielectric layer is formed on a sidewall of the first control gate. A first selective gate is formed beside the first dielectric layer, thereby constituting the capacitor including the first dielectric layer sandwiched by the first control gate and the first selective gate.

According to the above, the present invention provides a device including a capacitor and forming method thereof, which applies a first control gate and a first selective gate of a memory structure as two electrodes of a capacitor, and a first dielectric layer as a dielectric layer of the capacitor which is vertically sandwiched by the first control gate and the first selective gate, thereby constituting the capacitor. In this way, a high voltage capacitor can be formed, and a capacitor process can be integrated into a memory process. This improves capacitor quality, reduces processing cost and shrinks capacitor volume.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-9 schematically depict cross-sectional views of a device including a capacitor according to an embodiment of the present invention.

DETAILED DESCRIPTION

Figure 3:
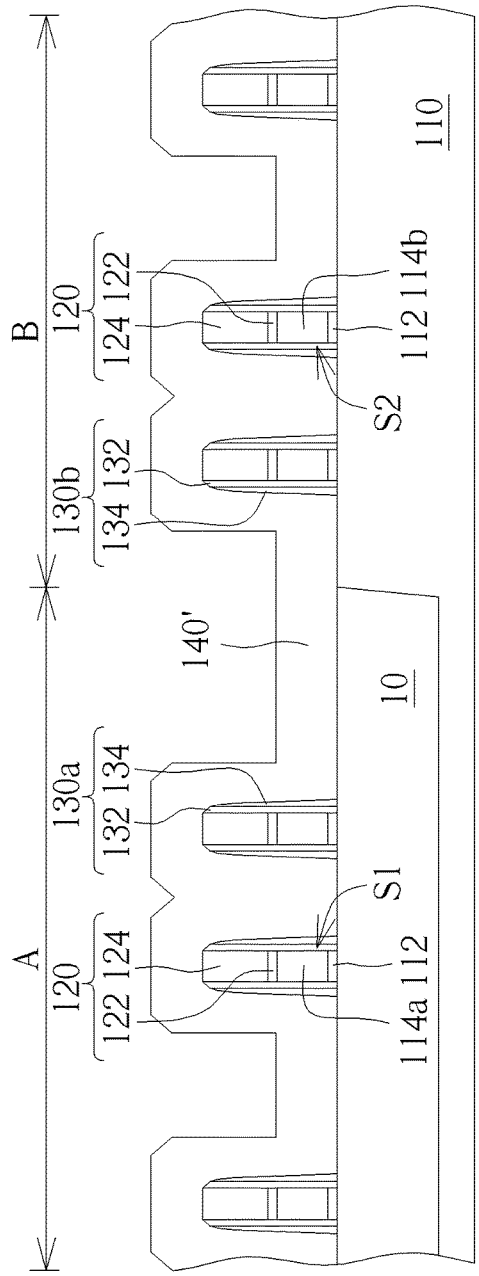

FIGS. 1-9 schematically depict cross-sectional views of a device including a capacitor according to an embodiment of the present invention. As shown in FIG. 1, a substrate 110 is provided. The substrate 110 may be a semiconductor substrate such as a silicon substrate, a silicon containing (such as silicon carbide) substrate, a III-V group-on-silicon (such as GaN-on-silicon) substrate, a graphene-on-silicon substrate, a silicon-on-insulator (SOI) substrate or a substrate containing epitaxial layers. The substrate 110 may include a first area A and a second area B. In this embodiment, the first area A is a capacitor area while the second area B is a memory cell area, but this is not limited thereto. An isolation structure 10 is only in the substrate 110 of the first area A and not in the substrate 110 of the second area B, thereby later formed capacitors which are directly on the isolation structure 10 can be electrically isolated from the substrate 110. The isolation structure 10 may be a shallow trench isolation (STI) structure, which may be formed by an STI process, but this is not limited thereto.

Charge trapping layers 112, first control gates 114a and hard masks 120 stacked on the isolation structure 10 of the first area A are formed, while charge trapping layers 112, second control gates 114b and hard masks 120 stacked on the substrate 110 of the second area B are formed. In this embodiment, the charge trapping layers 112 of the first area A and the second area B are formed on the substrate 110 at the same time, the first control gates 114a of the first area A and the second control gates 114b of the second area B are formed on the substrate 110 at the same time, and the hard masks 120 of the first area A and the second area B are formed on the substrate 110 at the same time, to integrate a capacitor process into a memory process, and simplify processes. The charge trapping layers 112 of the two areas include common materials, the first control gates 114a and the second control gates 114b of the two areas include common materials, and the hard masks 120 of the two areas include common materials. In other embodiments, the charge trapping layers 112, the first control gates 114a and the hard masks 120 directly on the isolation structure 10 of the first area A and the charge trapping layers 112, and the second control gates 114b and the hard masks 120 directly on the substrate 110 of the second area B may be respectively formed, and may be formed from different materials, depending upon practical requirements.

The charge trapping layers 112 may be oxide/nitride/oxide layers, and the first control gates 114a and the second control gates 114b may be polysilicon layers, but this is not limited thereto. In this embodiment, every hard mask 120 may be a two-layer structure including a bottom layer 122 and a top layer 124, wherein the bottom layer 122 may be an oxide layer, and the top layer 124 may be a nitride layer, but this is not limited thereto.

As shown in FIG. 2, a first dielectric layer 130a is formed on a sidewall S1 of every first control gate 114a, and a second dielectric layer 130b is formed on a sidewall S2 of every second control gate 114b at the same time. In this embodiment, the first dielectric layer 130a is formed on the sidewall of every first control gate 114a, every charge trapping layer 112 directly below the first control gate 114a, and every hard mask 120 directly above the first control gate 114a, and the second dielectric layer 130b is formed on the sidewall of every second control gate 114b, every charge trapping layer 112 directly below the second control gate 114b, and every hard mask 120 directly above the second control gate 114b, but this is not limited thereto. In other embodiments, the first dielectric layer 130a may be only formed on the sidewall S1 of every first control gate 114a, and the second dielectric layer 130b may be only formed on the sidewall S2 of every second control gate 114b. In this embodiment, every first dielectric layer 130a/second dielectric layer 130b may include an oxide layer 132 and a nitride layer 134, wherein the oxide layer 132 is preferably a high temperature oxide (HTO) layer. The first dielectric layer 130a thus has a high dielectric constant, and can serve as a dielectric material of a high voltage capacitor in the first area A, and the second dielectric layer 130b can serve as a dielectric material of a memory cell in the second area B for isolating the second control gate 114b from a later formed second selective gate, but this is not limited thereto. In other embodiments, each first dielectric layer 130a/second dielectric layer 130b may be one single dielectric layer having a high dielectric constant, a multilayer dielectric layer having a high dielectric constant, or a combination of a dielectric layer having a high dielectric constant, an oxide layer and a nitride layer etc., depending upon practical requirements.

Figure 4:
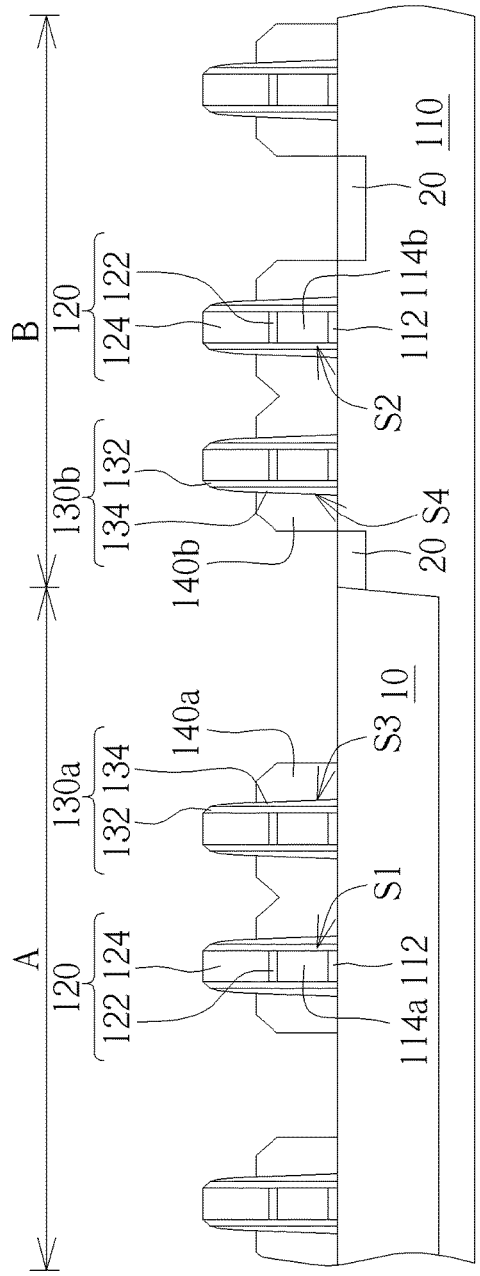

FIGS. 3-4 show a first selective gate 140a is formed on a sidewall S3 of every first dielectric layer 130a, thereby constituting the capacitors, wherein the first control gates 114a and the first selective gates 140a can serve as electrodes of the capacitors, and the first dielectric layers 130a are sandwiched by the first control gates 114a and the first selective gates 140a to serve as dielectric materials of the capacitors. Meanwhile, a second selective gate 140b is formed next to every second control gate 114b, thereby constituting memory cells. In this embodiment, the first selective gates 140a and the second selective gates 140b may include common materials, but this is not limited thereto.

As shown in FIG. 3, a first selective gate material 140' may cover the hard masks 120, the first dielectric layers 130a, the second dielectric layers 130b and the substrate 110. As shown in FIG. 4, the first selective gate material 140' is patterned and a part of the first selective gate material 140' is removed to form the first selective gates 140a and the second selective gates 140b, wherein the first selective gates 140a are only disposed on sidewalls of the first control gates 114a and parts of the sidewalls of the hard masks 120 directly above the first control gates 114a while the second selective gates 140b are only disposed on sidewalls of the second control gates 114b and parts of the sidewalls of the hard masks 120 directly above the second control gates 114b, but this is not limited thereto. Diffusion layers 20 are formed in the substrate 110 of the second area B next to the second selective gates 140b, for serving as drains or sources.

As shown in FIGS. 5-6, parts of the first selective gates 140a and the second selective gates 140b are removed. Methods of removing the parts of the first selective gates 140a and the second selective gates 140b may include the following. A patterned photoresist P is formed on the substrate 110 of the first area A and the second area B to expose parts of the first selective gates 140a and the second selective gates 140b, parts of the first selective gates 140a and the second selective gates 140b are then removed, and a doping process may be performed to form diffusion regions 30 in the substrate 110 of the second area B for serving as sources or drains, as shown in FIG. 5. Thereafter, the patterned photoresist P is removed, as shown in FIG. 6. In this embodiment, exposed parts of the hard masks 120, the first dielectric layers 130a and the second dielectric layers 130b may also be removed while parts of the first selective gates 140a and the second selective gates 140b are removed.

Figure 7:
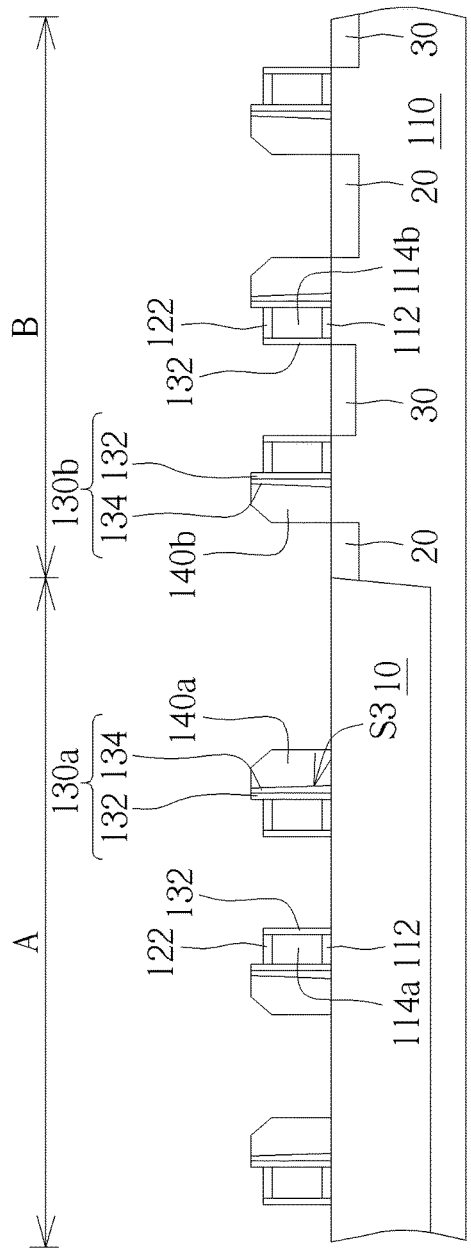

The top layers 124 of the hard masks 120 are removed while the bottom layers of the hard masks 120 are reserved. Meanwhile, the nitride layer 134 on one side of each first control gate 114a and the nitride layer 134 on one side of each second control gate 114b are removed while the oxide layer 132 on this side of each first control gate 114a and the oxide layer 132 on this side of each second control gate 114b are reserved, as shown in FIG. 7. This means the first dielectric layers 130a on the other side of each first control gate 114a and the second dielectric layers 130b on the other side of each second control gate 114b are reserved. Since the top layers 124 and the nitride layers 134 are all composed of silicon nitride, the top layers 124 and the nitride layers 134 can be removed simultaneously by one same process.

Figure 8:
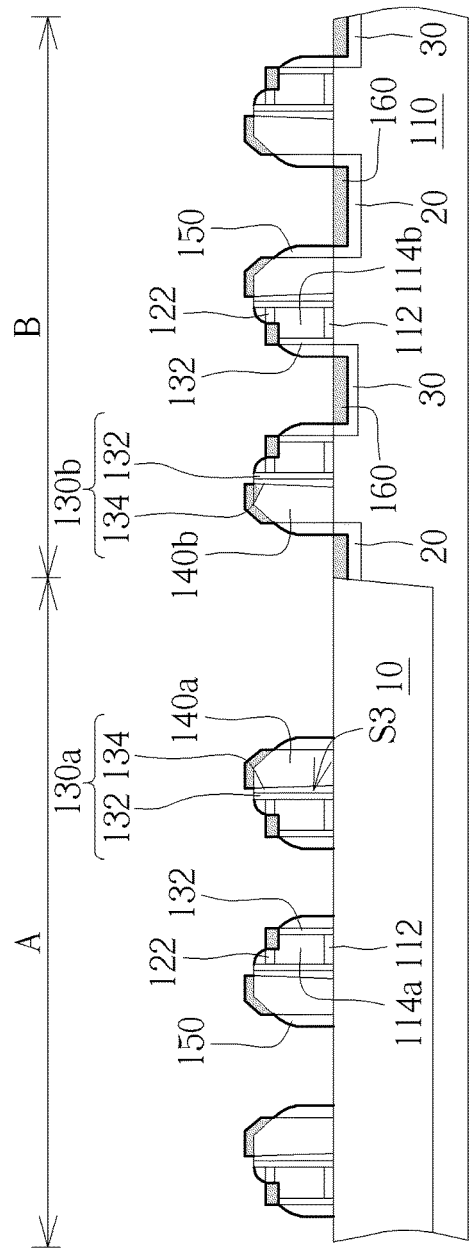

As shown in FIG. 8, spacers 150 are formed on the isolation structure 10 of the first area A next to the first control gates 114a and the first selective gates 140a, and on the substrate 110 of the first area B next to the second control gates 114b and the second selective gates 140b. Lightly doped source/drain regions (not shown) are selectively formed in the substrate 110 of the second area B next to the spacers 150. Metal silicide 160 may be formed on the doped regions 20/30 or the lightly doped source/drain regions (not shown). The metal silicide 160 may be also formed on the first selective gates 140a, parts of the first control gates 114a, the second selective gates 140b and parts of the second control gates 114b at the same time.

Figure 9:
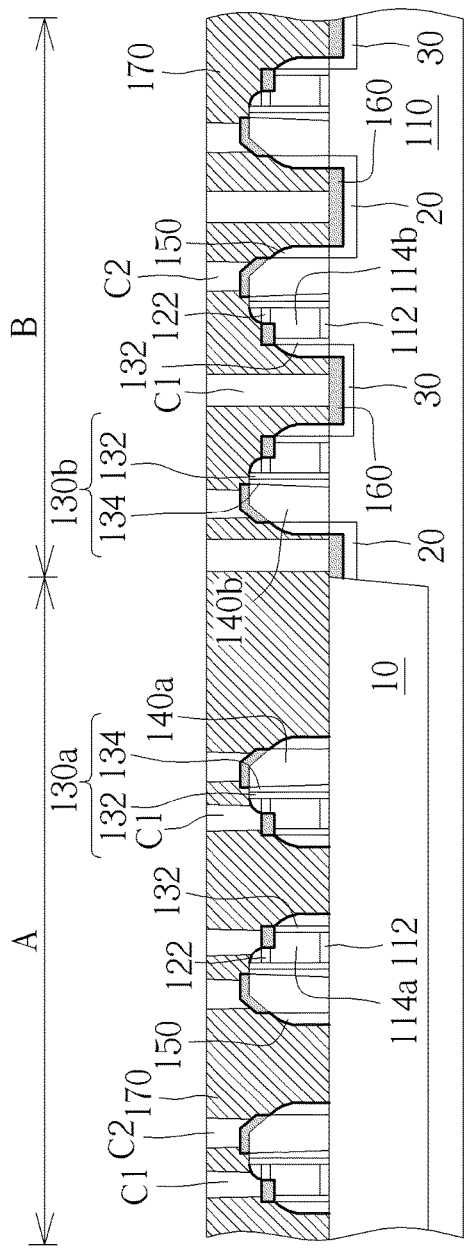
Figure 10:
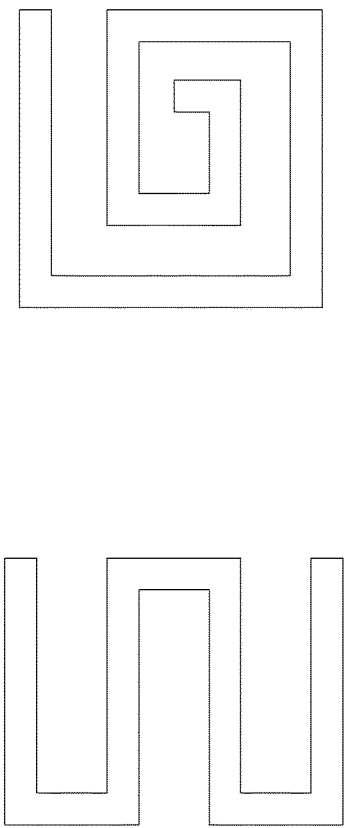
FIG. 10 schematically depicts top views of capacitors according to an embodiment of the present invention.

As shown in FIG. 9, a planarized inter-dielectric layer 170 may cover the first control gates 114a, the second control gates 114b, the first selective gates 140a, the second selective gates 140b, the spacers 150, the isolation structure 10 and the substrate 110. The planarized inter-dielectric layer 170 may be formed by an inter-dielectric material covering the first control gates 114a, the second control gates 114b, the first selective gates 140a, the second selective gates 140b, the spacers 150, the isolation structure 10 and the substrate 110. The inter-dielectric material is then planarized by processes such as a chemical mechanical polishing (CMP) process to form the planarized inter-dielectric layer 170. A plurality of contact plugs C1/C2 are formed in the planarized inter-dielectric layer 170, wherein the contact plugs C1/C2 physically connect the first control gates 114a of the first area A and the diffusion regions 20/30 of the second area B, and the contact plugs C2 physically connect the first selective gate 140a of the first area A and the second selective gates 140b of the second area B. The first control gates 114a of the first area A serve as anodes of the capacitors while the first selective gates 140a of the first area A serve as cathodes of the capacitors. A plurality of memory cells are also formed in the second area B. FIG. 10 schematically depicts top views of capacitors according to embodiments of the present invention. As shown in FIG. 10, a layout of a capacitor may be a snake shape (the left diagram), a spiral shape (the right diagram) or other shapes.

To summarize, the present invention provides a device including a capacitor and a forming method thereof, which applies a first control gate and a first selective gate of a memory structure as two electrodes of the capacitor, and a first dielectric layer as a dielectric layer of the capacitor, which is vertically sandwiched by the first control gate and the first selective gate, thereby constituting the capacitor. In this way, a high voltage capacitor can be formed, the quality of the capacitor can be enhanced, the capacitor volume can be shrunk, and a capacitor process can be integrated into a memory process.

Preferably, the first dielectric layer may include an oxide layer and a nitride layer, or a dielectric layer having a high dielectric constant, wherein the oxide layer preferably includes a high temperature oxide layer so that the dielectric layer has a high dielectric constant and high quality. Furthermore, a substrate may include a first area and a second area, and an isolation structure is only disposed in the first area without being disposed in the second area. The capacitor of the present invention may be formed directly above the isolation structure, so that the capacitor can be isolated from the substrate. A memory cell may be formed on the substrate of the second area, and the memory cell preferably has a same structure as the capacitor of the first area. In this way, a capacitor process can be integrated into a memory process, thereby simplifying processes and reducing processing costs. The memory cell may include a second control gate disposed directly above the substrate, a charge trapping layer disposed between the second control gate and the substrate, and a second selective gate disposed next to the second control gate.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a device comprising a capacitor, comprising:
   providing a substrate comprising a capacitor area and a memory cell area, wherein the capacitor area comprises the capacitor;
   forming an isolation structure in the substrate of the capacitor area;
   forming a first control gate directly above the isolation structure;
   forming a first dielectric layer on a sidewall of the first control gate;
   forming a first selective gate beside the first dielectric layer, thereby constituting the capacitor comprising the first dielectric layer sandwiched by the first control gate and the first selective gate;
   forming a second control gate directly above the substrate of the memory cell area while the first control gate directly above the isolation structure is formed;
   forming a second selective gate next to the second control gate while the first selective gate next to the first dielectric layer is formed, thereby a memory cell is formed;
   forming doped regions in the substrate and at opposite two sides of the second control gate and the second selective gate; and
   forming metal silicides on a part of the first control gate, a part of the first selective gate, a part of the second control gate, a part of the second selective gate and the doped regions, wherein the second control gate, the second selective gate and the doped regions are in the same capacitor area.

2. The method of forming the device comprising the capacitor according to claim 1, wherein the first dielectric layer comprises an oxide layer and a nitride layer, or a dielectric layer having a high dielectric constant.

3. The method of forming the device comprising the capacitor according to claim 2, wherein the oxide layer comprises a high temperature oxide layer.

4. The method of forming the device comprising the capacitor according to claim 1, wherein the isolation structure comprises a shallow trench isolation structure.

5. The method of forming the device comprising the capacitor according to claim 1, further comprising:
   forming a charge trapping layer directly on the isolation structure before the first control gate is formed.

6. The method of forming the device comprising the capacitor according to claim 1, wherein the steps of forming the first control gate, the first dielectric layer and the first selective gate comprise:
   forming the first control gate and a hard mask stacked from bottom to top and directly above the isolation structure;
   forming the first dielectric layer on the sidewall of the first control gate and a sidewall of the hard mask;
   forming the selective gate next to the first dielectric layer; and
   removing the hard mask and the first dielectric layer on the sidewall of the hard mask.

7. The method of forming the device comprising the capacitor according to claim 1, further comprising:
   forming a charge trapping layer directly on the isolation structure of the capacitor area and directly on the substrate of the memory cell area at the same time.

8. The method of forming the device comprising the capacitor according to claim 1, further comprising:
   forming a second dielectric layer on a sidewall of the second control gate while the first dielectric layer on the sidewall of the first control gate is formed.

* * * * *